United States Patent
Liau et al.

(10) Patent No.: US 12,407,445 B2
(45) Date of Patent: Sep. 2, 2025

(54) SYSTEMS AND METHODS FOR IMPROVING COMMUNICATION THROUGHPUT

(71) Applicant: Hughes Network Systems, LLC, Germantown, MD (US)

(72) Inventors: Victor Liau, Germantown, MD (US); Glenn Robins, Germantown, MD (US); Mustafa Eroz, Germantown, MD (US); Lin-nan Lee, Germantown, MD (US)

(73) Assignee: Hughes Network Systems, LLC

( * ) Notice: Subject to any disclaimer, the term of this patent is extended or adjusted under 35 U.S.C. 154(b) by 596 days.

(21) Appl. No.: 17/843,712

(22) Filed: Jun. 17, 2022

(65) Prior Publication Data
US 2023/0239075 A1    Jul. 27, 2023

Related U.S. Application Data

(60) Provisional application No. 63/301,762, filed on Jan. 21, 2022.

(51) Int. Cl.
*H04L 1/00* (2006.01)
*H04W 24/02* (2009.01)

(52) U.S. Cl.
CPC .......... *H04L 1/0071* (2013.01); *H04L 1/0057* (2013.01); *H04W 24/02* (2013.01)

(58) Field of Classification Search
CPC ......... H03M 13/1102; H03M 13/2703; H03M 13/33; H04L 1/0041; H04L 1/0057; H04L 1/0065; H04L 1/0071; H04W 24/02
See application file for complete search history.

(56) References Cited

U.S. PATENT DOCUMENTS

| | | | |
|---|---|---|---|
| 4,206,440 A | 6/1980 | Doi et al. | |
| 6,791,955 B1 | 9/2004 | Kikuchi et al. | |
| 7,305,606 B2 * | 12/2007 | Hoshizawa | G11B 20/1866 714/763 |
| 8,045,863 B2 | 10/2011 | Meagher et al. | |
| 2002/0031146 A1 * | 3/2002 | Abbas | H04J 3/0605 370/476 |
| 2007/0220408 A1 * | 9/2007 | Huggett | H03M 13/2948 714/795 |

(Continued)

OTHER PUBLICATIONS

N. S. Muhammad, "Short Inner Block Codes for Serial Concatenated Codes and Bit-Interleaved Coded Modulation," 2009 IEEE 70th Vehicular Technology Conference Fall, Anchorage, AK, USA, 2009, pp. 1-5. (Year: 2009).*

(Continued)

*Primary Examiner* — Albert Decady
*Assistant Examiner* — Enamul M Kabir
(74) *Attorney, Agent, or Firm* — Global IP Counsellors, LLP

(57) ABSTRACT

Communication terminals, systems and methods are disclosed herein. In an embodiment, a method for improving communication throughput when experiencing periodic blockages includes generating at least one outer code block including a plurality of sync data elements, writing the sync data elements from the at least one outer code block to a same column of at least one interleaver including a plurality of rows and a plurality of columns, and writing additional data elements from the outer code block to other columns of the at least one interleaver.

20 Claims, 16 Drawing Sheets

(56) References Cited

U.S. PATENT DOCUMENTS

2009/0028247 A1    1/2009  Suh et al.
2015/0222294 A1*  8/2015  Eroz ................... H03M 13/27
                                                                                         714/776

OTHER PUBLICATIONS

A. Nilsson and T. M. Aulin, "Bit Interleaved Coded Modulation with Multi-Labeled Signal Mapping," 2007 IEEE International Symposium on Information Theory, Nice, France, 2007, pp. 2141-2145. (Year: 2007).*
Y. Q. Shi, Xi Min Zhang, Zhi-Cheng Ni and N. Ansari, "Interleaving for combating bursts of errors," in IEEE Circuits and Systems Magazine, vol. 4, No. 1, pp. 29-42, 2004. (Year: 2004).*
International Search Report and Written Opinion issued Jun. 7, 2023 in corresponding International Application No. PCT/US2023/011274.

* cited by examiner

* Beginning of First Full Outer Code Block in Interleaver

| Label | Interleaver # | Sync on Interleaver Row | Outer Code Block # | Begin Outer Code in Interleaver Col | Begin Outer Code in Interleaver Col |
|---|---|---|---|---|---|
| a | 0 | 0 | 0 | 0 | 1 |
| b | 0 | 2 | 0 | 0 | 1 |
| c | 0 | 5 | 0 | 0 | 1 |
| d | 0 | 7 | 0 | 0 | 1 |
| e | 1 | 0 | 2 | 6 | 3 |
| f | 1 | 2 | 2 | 6 | 3 |
| g | 1 | 5 | 2 | 6 | 3 |
| h | 1 | 7 | 2 | 6 | 3 |
| i | 2 | 0 | 4 | 2 | 6 |
| j | 2 | 2 | 4 | 2 | 6 |
| k | 2 | 5 | 4 | 2 | 6 |
| l | 2 | 7 | 4 | 2 | 6 |

| # | Code Rate R | M | Parity Percent (%) | iter peak | total iter | trials | Average iter/trial | bit correct capability (%) | Byte interleaver 8-bit erasure group iter peak | total iter | trials | Average iter/trial | byte correct capability (%) |
|---|---|---|---|---|---|---|---|---|---|---|---|---|---|
| 1 | R4/5 | 256 | 20.0 | 39 | 300695 | 10000 | 30.07 | 18.4 | 38 | 168500 | 10000 | 16.85 | 17.7 |
| 0 | R4/5 | 128 | 20.0 | 42 | 267302 | 10000 | 26.73 | 18.3 | 22 | 136889 | 10000 | 13.69 | 17.3 |
| 3 | R19/25 | 256 | 24.0 | 56 | 411523 | 10000 | 41.15 | 22.3 | 45 | 236432 | 10000 | 23.49 | 21.8 |
| 2 | R19/25 | 128 | 24.0 | 48 | 346424 | 10000 | 34.64 | 22.2 | 41 | 182047 | 10000 | 18.20 | 21.4 |
| 5 | R5/7 | 256 | 28.6 | 75 | 444929 | 10000 | 44.49 | 26.7 | 85 | 266100 | 10000 | 26.61 | 26.2 |
| 4 | R5/7 | 128 | 28.6 | 66 | 394634 | 10000 | 39.46 | 26.6 | 49 | 195458 | 10000 | 19.65 | 25.7 |
| 7 | R2/3 | 256 | 33.3 | 60 | 437736 | 10000 | 43.77 | 31.3 | 42 | 265716 | 10000 | 26.57 | 30.7 |
| 6 | R2/3 | 128 | 33.3 | 81 | 431373 | 10000 | 43.14 | 31.3 | 31 | 168791 | 10000 | 16.88 | 29.7 |
| 9 | R3/5 | 256 | 40.0 | 103 | 539310 | 10000 | 53.93 | 37.8 | 40 | 274058 | 10000 | 27.41 | 37.0 |
| 8 | R3/5 | 128 | 40.0 | 56 | 386903 | 10000 | 38.69 | 37.6 | 35 | 209071 | 10000 | 20.91 | 36.4 |
| 11 | R2/5 | 256 | 60.0 | 107 | 539875 | 10000 | 53.99 | 58.0 | 55 | 333476 | 10000 | 33.35 | 56.8 |
| 10 | R2/5 | 128 | 60.0 | 104 | 680741 | 10000 | 68.07 | 57.7 | 41 | 269023 | 10000 | 26.90 | 56.1 |
| 13 | R1/3 | 256 | 66.7 | 96 | 586537 | 10000 | 58.65 | 64.2 | 105 | 409345 | 10000 | 40.93 | 63.6 |
| 12 | R1/3 | 128 | 66.7 | 94 | 591160 | 10000 | 59.12 | 64.2 | 84 | 288417 | 10000 | 28.84 | 62.7 |

FIG. 14

| Byte interleaver 4-bit erasure group | | | | | Byte interleaver 2-bit erasure group | | | | | Byte interleaver 1-bit erasure group | | | | |
| --- | --- | --- | --- | --- | --- | --- | --- | --- | --- | --- | --- | --- | --- | --- |
| iter peak | total iter | trials | Average iter/trial | byte correct capability (%) | iter peak | total iter | trials | Average iter/trial | byte correct capability (%) | iter peak | total iter | trials | Average iter/trial | byte correct capability (%) |
| 38 | 167638 | 10000 | 16.76 | 17.7 | 22 | 135628 | 10000 | 13.56 | 17.3 | 25 | 148216 | 10000 | 14.82 | 17.5 |
| 28 | 129994 | 10000 | 13.00 | 17.2 | 17 | 118600 | 10000 | 11.86 | 17.0 | 16 | 105001 | 10000 | 10.50 | 16.7 |
| 39 | 234931 | 10000 | 23.49 | 21.8 | 35 | 202283 | 10000 | 20.23 | 21.6 | 22 | 159446 | 10000 | 15.94 | 21.2 |
| 26 | 154672 | 10000 | 15.47 | 21.1 | 29 | 153499 | 10000 | 15.35 | 21.1 | 17 | 112018 | 10000 | 11.20 | 20.3 |
| 49 | 265436 | 10000 | 26.54 | 26.2 | 40 | 227630 | 10000 | 22.76 | 26.0 | 32 | 189762 | 10000 | 18.98 | 25.7 |
| 55 | 176531 | 10000 | 17.65 | 25.5 | 33 | 167491 | 10000 | 16.75 | 25.4 | 28 | 147295 | 10000 | 14.73 | 25.1 |
| 60 | 248487 | 10000 | 24.85 | 30.6 | 37 | 236545 | 10000 | 23.65 | 30.5 | 28 | 201765 | 10000 | 20.18 | 30.2 |
| 36 | 187072 | 10000 | 18.71 | 30.0 | 42 | 186920 | 10000 | 18.69 | 30.0 | 28 | 144790 | 10000 | 14.48 | 29.3 |
| 47 | 272417 | 10000 | 27.24 | 37.0 | 38 | 233211 | 10000 | 23.32 | 36.7 | 45 | 222581 | 10000 | 22.26 | 36.6 |
| 39 | 192853 | 10000 | 19.29 | 36.2 | 32 | 191741 | 10000 | 19.17 | 36.2 | 26 | 160252 | 10000 | 16.03 | 35.6 |
| 58 | 398070 | 10000 | 39.81 | 57.2 | 62 | 378260 | 10000 | 37.83 | 57.1 | 46 | 298218 | 10000 | 29.82 | 56.5 |
| 33 | 239266 | 10000 | 23.93 | 55.7 | 42 | 264244 | 10000 | 26.42 | 56.1 | 31 | 200724 | 10000 | 20.07 | 54.9 |
| 92 | 368342 | 10000 | 36.83 | 63.4 | 83 | 365144 | 10000 | 36.51 | 63.4 | 77 | 337779 | 10000 | 33.78 | 63.2 |
| 83 | 304977 | 10000 | 30.50 | 62.9 | 64 | 282426 | 10000 | 28.24 | 62.7 | 62 | 230026 | 10000 | 23.00 | 62.0 |

FIG. 14(CONTINUED)

SYSTEMS AND METHODS FOR IMPROVING COMMUNICATION THROUGHPUT

CROSS REFERENCE TO RELATED APPLICATIONS

This application claims priority to U.S. Provisional Application No. 63/301,762, filed Jan. 21, 2022, entitled "Synchronization of the Outer Erasure Code", the entire contents of which is incorporated herein by reference and relied upon.

FIELD OF THE INVENTION

The present disclosure is directed to systems and methods for improving communication throughput. More specifically, the present disclosure is directed to systems and methods for improving communication throughput when experiencing periodic blockages.

BACKGROUND INFORMATION

Transmissions between a transmitter and a receiver can be subject to recurring blockages. For example, the transmitter and the receiver on a helicopter's satellite communication terminal can be periodically blocked by the helicopter's rotating blades. The blocked data can be corrupted, requiring error corrections or retransmissions, which can take time and require excess bandwidth and processing power.

SUMMARY

Communication terminals often use block code for data transmissions. For low-density parity check (LDPC) erasure code, determining the beginning of a code block boundary and aligning to the beginning of an interleaver boundary are critical to countering periodic blockages such as those caused by helicopter blades. The systems and methods disclosed herein are configured to synchronize the code block and interleaver boundaries to reduce acquisition time to approximately an interleaver duration.

The systems and methods disclosed herein are also configured to synchronize at the byte level to achieve minimal acquisition time. Accessing the LDPC erasure code and the interleaver as bytes is faster and more suitable for microprocessor interfaces. Byte interleavers can degrade the performance of the LDPC erasure code decoding performance, but the systems and methods of the present disclosure bring the LDPC erasure code decoding performance back to the performance of a bit interleaver by performing local interleaving of the byte accesses between the outer code block and the interleaver block.

Previous Upper Layer Protocol Enhancement (ULPE) generations used a parity check code (PCC) and a Hamming code. Both generations needed synchronization. The present disclosure presents a synchronization scheme for a third generation ULPE. There is no known prior scheme to synchronize for the given LDPC erasure code with a bit interleaver and with a byte interleaver. While the benefits of working in bytes are faster accesses and processing, the performance of the erasure LDPC code may degrade with the byte interleaver. A technique of local interleaving together with the byte interleaver is demonstrated that can recover some of the performance loss.

In view of the state of the known technology, one aspect of the present disclosure is to provide a method for improving communication throughput when experiencing periodic blockages. The method includes generating at least one outer code block including a plurality of sync data elements, writing the sync data elements from the at least one outer code block to a same column of at least one interleaver including a plurality of rows and a plurality of columns, and writing additional data elements from the outer code block to other columns of the at least one interleaver.

Another aspect of the present disclosure is to provide another method for improving communication throughput when experiencing periodic blockages. The method includes generating a plurality of outer code blocks each including at least one sync data element, writing the sync data elements from the plurality of outer code blocks to same columns of a plurality of interleavers each including a plurality of rows and a plurality of columns, and using the sync data elements to distinguish between different interleavers of the plurality of interleavers.

Another aspect of the present disclosure is to provide another method for improving communication throughput when experiencing periodic blockages. The method includes generating at least one outer code block including a plurality of bytes, writing the bytes from the outer code block into a plurality of interleavers each including a plurality of rows and a plurality of columns, and using at least one sync byte with multiple labels to identify at least one of the plurality of interleavers.

Also, other objects, features, aspects and advantages of the disclosed systems and methods will become apparent to those skilled in the art in the field of portable satellite terminals from the following detailed description, which, taken in conjunction with the annexed drawings, discloses preferred embodiments of a communication terminal, system and method with various features.

BRIEF DESCRIPTION OF THE DRAWINGS

Referring now to the attached drawings which form a part of this original disclosure:

FIG. 14 illustrates a comparison of bit interleaving and byte interleaving.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
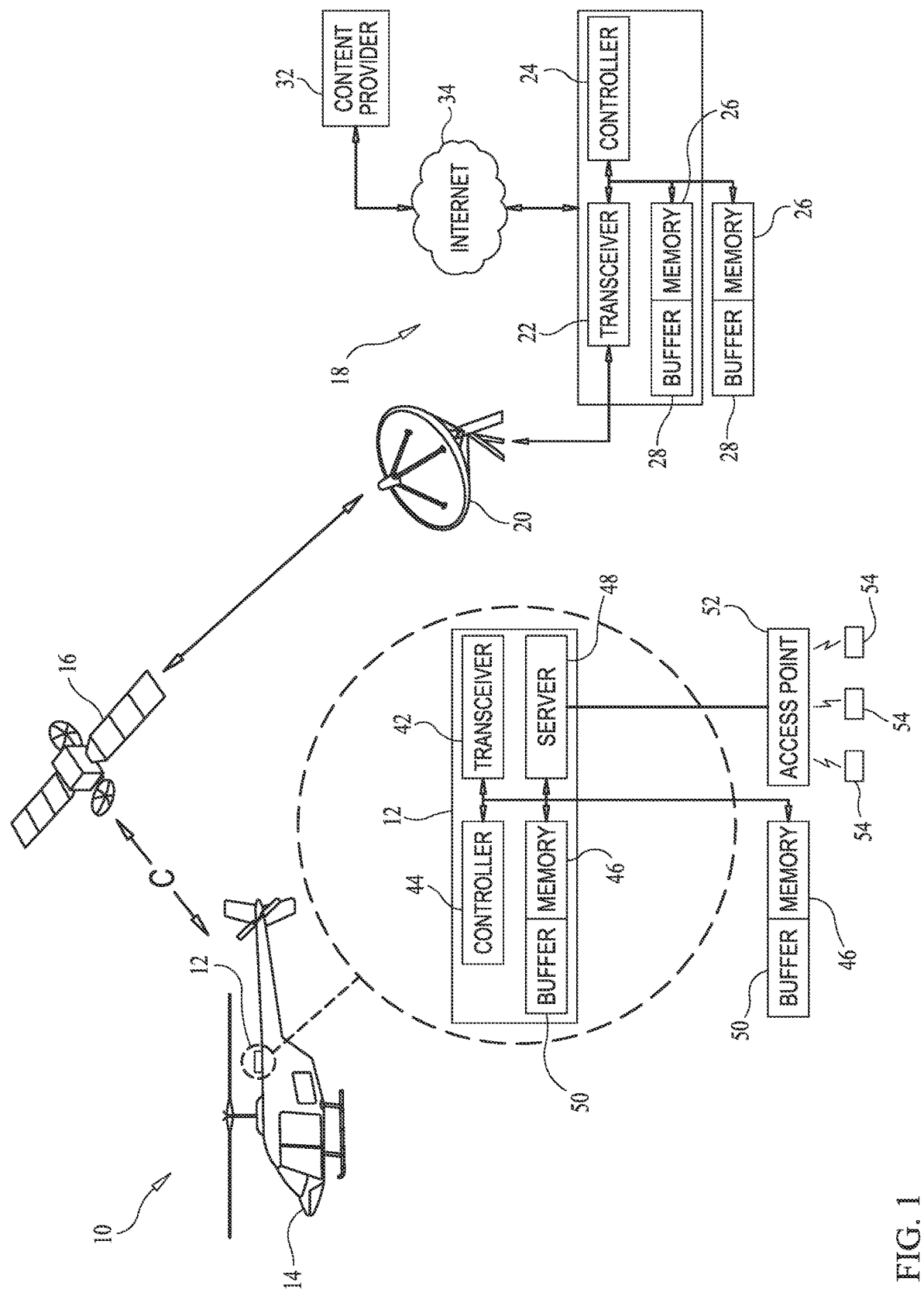
FIG. 1 illustrates an example embodiment of a satellite communication system in accordance with the present disclosure.

FIG. 1 illustrates an example embodiment of a communication system 10 in accordance with the present disclosure. The system 10 includes at least one communication terminal 12. In the illustrated embodiment, the communication terminal 12 is a portable satellite terminal installed on a helicopter 14. In the illustrated embodiment, the system 10 further includes at least one satellite 16 and at least one gateway 18. The communication terminal 12, the satellite 16 and the gateway 18 typically communicate with each other over a radio frequency link, such as a Ku-band link, a Ka-band link, an L band link, an S band link or any other suitable type of link as understood in the art. The communication terminal 12 is configured to communicate with the gateway 18 via the satellite 16. Likewise, the gateway 18 is configured to communicate with the communication terminal 12 via the satellite 16.

As illustrated, the helicopter 14 includes a rotor with several blades which can interrupt the line of communication C between the communication terminal 12 and the satellite 16 each time a blade crosses the line of communication C. The rotation of the blades therefore causes periodic blockages (e.g., repeated temporary interruptions) in the ability of the communication terminal 12 to send and/or receive data. The blockage periods are relatively short and can vary, for example, depending on the width of the blades, the distance between the rotor and the communication terminal 12, the azimuth and elevation angle of the satellite 16, the clearance height between the communication terminal 12 and the blades, the speed of the rotor, and/or other factors. Data packets transmitted during a blockage can be either completely lost or severely attenuated. The present disclosure provides systems and methods for dealing with such periodic blockages. The communication terminal 12 can also be installed on other vehicles or structures or at other locations that experience periodic blockages due to factors other than rotating blades.

In the illustrated embodiment, the gateway 18 is configured to process data received from the communication terminal 12 via the satellite 16. The gateway 18 can include an antenna dish 20, a transceiver 22, a controller 24, one or more memory 26 and other types of equipment (not shown) such as amplifiers, waveguides and so on as understood in the art which enable communication between gateways 18 and communication terminals 12 via one or more of the orbiting satellites 16. A transceiver 22 can include, for example, an integrated satellite modem and any other suitable equipment which enables the transceiver 22 to communicate with one or more of the orbiting satellites 16 as understood in the art. As understood in the art, the controller 24 preferably includes a microcomputer with a control program that controls the gateway 18 as discussed herein. The controller 24 can also include other conventional components such as an input interface circuit, an output interface circuit, and storage devices such as a ROM (Read Only Memory) device and a RAM (Random Access Memory) device. The RAM and ROM store processing results and control programs that are run by the controller 24. The controller 24 is operatively coupled to the components of the gateway 18 as appropriate, in a conventional manner. It will be apparent to those skilled in the art from this disclosure that the precise structure and algorithms for the controller 24 can be any combination of hardware and software that will carry out the functions of the present disclosure. The one or more memory 26 can be, for example, an internal memory in the gateway 18, or other type of memory devices such as flash memory or hard drives with an external high speed interface such as a USB bus or an SATA bus, or remote memories such as cloud storage and so on. These other types of memory can be present at the gateway 18 or accessible at a location apart from the gateway 18 via a network connection such as an Ethernet connection, a WiFi connection or any other suitable type of connection as understood in the art. Also, the memory 26 can include at least one buffer 28 which is configured to buffer, for example, data transmitted to or from a memory 26.

In an embodiment, the gateway 18 can include or be configured as an inroute group manager, which can be configured to control the bandwidth allocations to the communication terminals 12 (e.g., on an inroute or inroute group basis), and to correspondingly control and administer the bandwidth allocation approaches. Also, one or more gateway 18 can include or be configured as a network management system, which, among other things, operates to communicate with remote sites, such as web content providers 32, via the internet 34, cloud storage, or other communication networks as understood in the art. In addition, the gateways 18 can communicate with each other via, for example, the Internet 34 or other communication networks.

In the illustrated embodiment, the communication terminal 12 includes a transceiver 42, a controller 44, one or more memory 44, a local server 48 and other types of equipment (not shown) such as amplifiers, waveguides and so on as understood in the art which enable communication between communication terminals 12 and gateways 18 via one or more of the orbiting satellites 16. A transceiver 42 can include, for example, an integrated satellite modem and any other suitable equipment which enables the transceiver 42 to communicate with one or more of the orbiting satellites 16 as understood in the art. As understood in the art, the controller 44 preferably includes a microcomputer with a control program that controls the communication terminal 12 as discussed herein. The controller 44 can also include other conventional components such as an input interface circuit, an output interface circuit, and storage devices such as a ROM (Read Only Memory) device and a RAM (Random Access Memory) device. The RAM and ROM store processing results and control programs that are run by the controller 44. The controller 44 is operatively coupled to the components of the communication terminal 12 as appropriate, in a conventional manner. It will be apparent to those skilled in the art from this disclosure that the precise structure and algorithms for the controller 44 can be any combination of hardware and software that will carry out the functions of the present disclosure. The one or more memory 46 can be, for example, an internal memory in the communication terminal 12, or other type of memory devices such as a flash memory or hard drives with an external high speed interface such as a USB bus or an SATA bus, or remote memories such as cloud storage and so on. These other types of memory can be present at the communication terminal 12 or accessible at a location apart from the communication terminal 12 (e.g., elsewhere on the helicopter 14) via a network connection such as an Ethernet connection, a WiFi connection or any other suitable type of connection as understood in the art. Moreover, the one or more memory 46 can include at least one buffer 50 which is configured to buffer, for example, data transmitted to or from a memory 46.

In an embodiment, the local server 48 is configured to enable local communication. The local server 48 can also include or communicate with an access point 52, such as a wireless application protocol (WAP) or any other suitable device, which enables the local server 48 to send and receive data to and from other devices 54. The other devices 54 can include, for example, equipment on the helicopter 14 or user devices such as desktop computers, laptop or notebook computers, tablets (e.g., iPads), smart phones, or any other suitable devices as understood in the art. The communications between the local server 48, the access point 52 and the other devices 54 can occur over wireless connections, such as WiFi connections, as well as wired connections as understood in the art.

The transmissions to and/or from the communication terminal 12 are burst-mode transmissions wherein a data stream is segmented into data packets having a fixed size. The packet size can vary. The packets are of a size reflecting a fraction of the transmission duration that is free of any blockage from helicopter blades or other obstructions. If the size of a packet is larger than the blockage-free duration of transmissions, then every packet will be partially blocked or attenuated. With respect to the duration of the blockage from a blade, there is a tradeoff between packet size and data loss. For increased efficiency, the packet should also be of a size smaller than the duration of the blockage. Where the packet size is smaller than the blockage duration, because the packets and the blades are not synchronized, a blade will generally block two packets partially, with possibly one or more completely blocked packets between the two partially blocked packets. Accordingly, longer packets effectively cause increased data loss, because a partially blocked packet is treated in the same manner as a fully blocked packet. On the other hand, while a very short packet size would reduce this loss in efficiency, each packet introduces overhead (e.g., processing overhead) and inefficiencies resulting therefrom.

Figure 2:
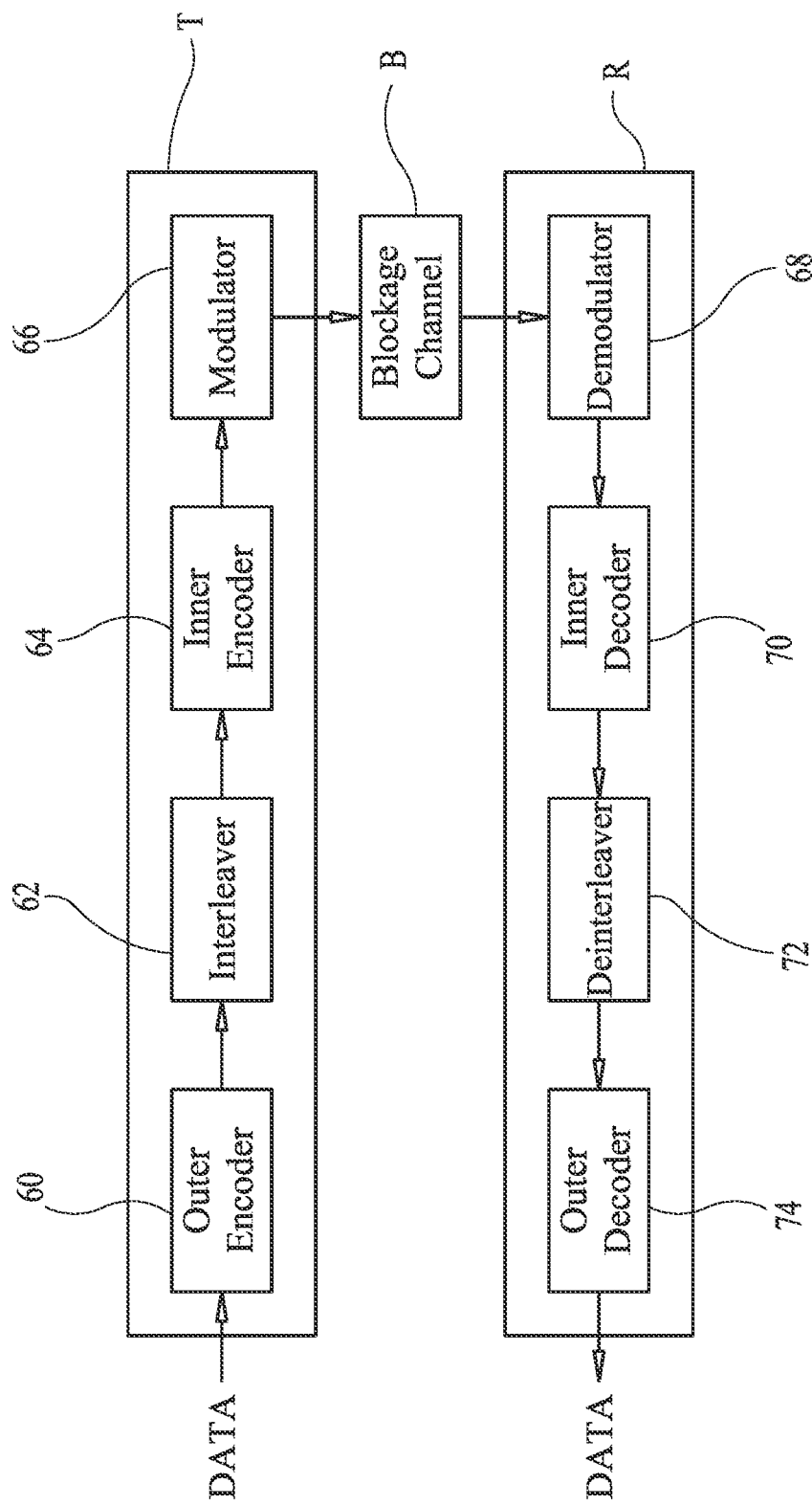
FIG. 2 illustrates a block diagram of an example embodiment of a transmitter and receiver configured to operate in the system of FIG. 1.

FIG. 2 illustrates a block diagram of an example transmitter T and receiver R configured to operate in the system 10 shown in FIG. 1. Each of the communication terminal 12 and the gateway 18 can include a transmitter T and a receiver R. During a particular data transmission from the perspective of FIG. 2, the communication terminal 12 includes one of the transmitter T and receiver R (e.g., at the transceiver 42), and the gateway 18 includes the other of the transmitter T and receiver R (e.g., at the transceiver 22), depending on whether the data transmission is to or from the communication terminal 12. The blockage channel B represents the communication channel that experiences periodic blockage, for example, due to the rotation of helicopter blades. In the illustrated embodiment, the transmitter T includes an outer encoder 60, an interleaver 62, an inner encoder 64 and a modulator 66, while the receiver R includes a demodulator 68, an inner decoder 70, a deinterleaver 72, and an outer decoder 74.

At the transmission side, the outer encoder 60 receives data from a data source. For example, the data can come from equipment on the helicopter 14 or other devices 54. The data is segmented into a plurality of fixed size packets for data transmission. The outer encoder 60 is configured to apply a parity check coding as an outer code and generate an outer code block 61. The size of the outer code block 61 is fixed. For example, the size of the outer code block can be 13400 bits or 67200 bits. The outer code block 61 can have a plurality of rows and a plurality of columns. As seen for example at FIGS. 4 and 9, each of the rows and columns includes a plurality of data elements (e.g., bits or bytes), with each data element corresponding to a column and row.

The interleaver 62 includes a plurality of rows and a plurality of columns. Different systems 10 will used different sizes of interleavers 62, with the total size selected based on the blockage period. More specifically, the size is selected based on the burst duration between periodic blockages. The goal is to size the interleaver 62 as close to the burst duration as possible without going over. This time span may correspond to more than one inner or outer code blocks 61. The number of data elements (e.g., bits or bytes) in each row of the interleaver 62 can be chosen to be similar to one inner code input block size.

Typically, when the rotating blades of the helicopter 14 block transmission to or from the communication terminal 12, the blocked transmission is represented by erroneously received inner code blocks. The system 10 sets the size of the interleaver 62 to be the same as the interval in time between blockages. Each row of the interleaver 62 consists of bits/bytes for one inner code block burst. Thus, each row represents one burst duration, which depends on the symbol rate to determine the specific time duration. The number of rows in the interleaver 62 are the whole number of burst duration that fit within the blade blockage interval, as illustrated in FIGS. 3A and 3B.

The interleaver 62 can be a bit-interleaver 62A or a byte-interleaver 62B in accordance with the present disclosure. With a bit-interleaver 62A, a single bit is written column-wise (down columns) at a time and read out row-wise (across rows). With a byte-interleaver 62B, a single byte (8 bits) is written column-wise at a time and read out row-wise. FIG. 3A illustrates an example embodiment of a bit interleaver 62A with a single sync data element (here, a sync bit) per row, while FIG. 3B illustrates an example embodiment of a byte interleaver 62B with a single sync data element (here, sync byte) per row. In FIGS. 3A and 3B, each row within the interleaver 62 is the content of an inner burst LDPC code block and contains the sync data element as a bit or a byte, respectively. As discussed in more detail below, the sync data element is placed at the beginning of the inner code block for simplicity. Other information data elements (bits or bytes) besides sync data elements populate the interleaver 62 starting at column 2 onward. For different inner code rates such as R=n/9 where n={1, 2, 3, 4, 5, 6, 7} of the Advance Microsat Waveform (AMW), the rows are (n×800 bits) or equivalently (n×100 bytes).

Figure 3:
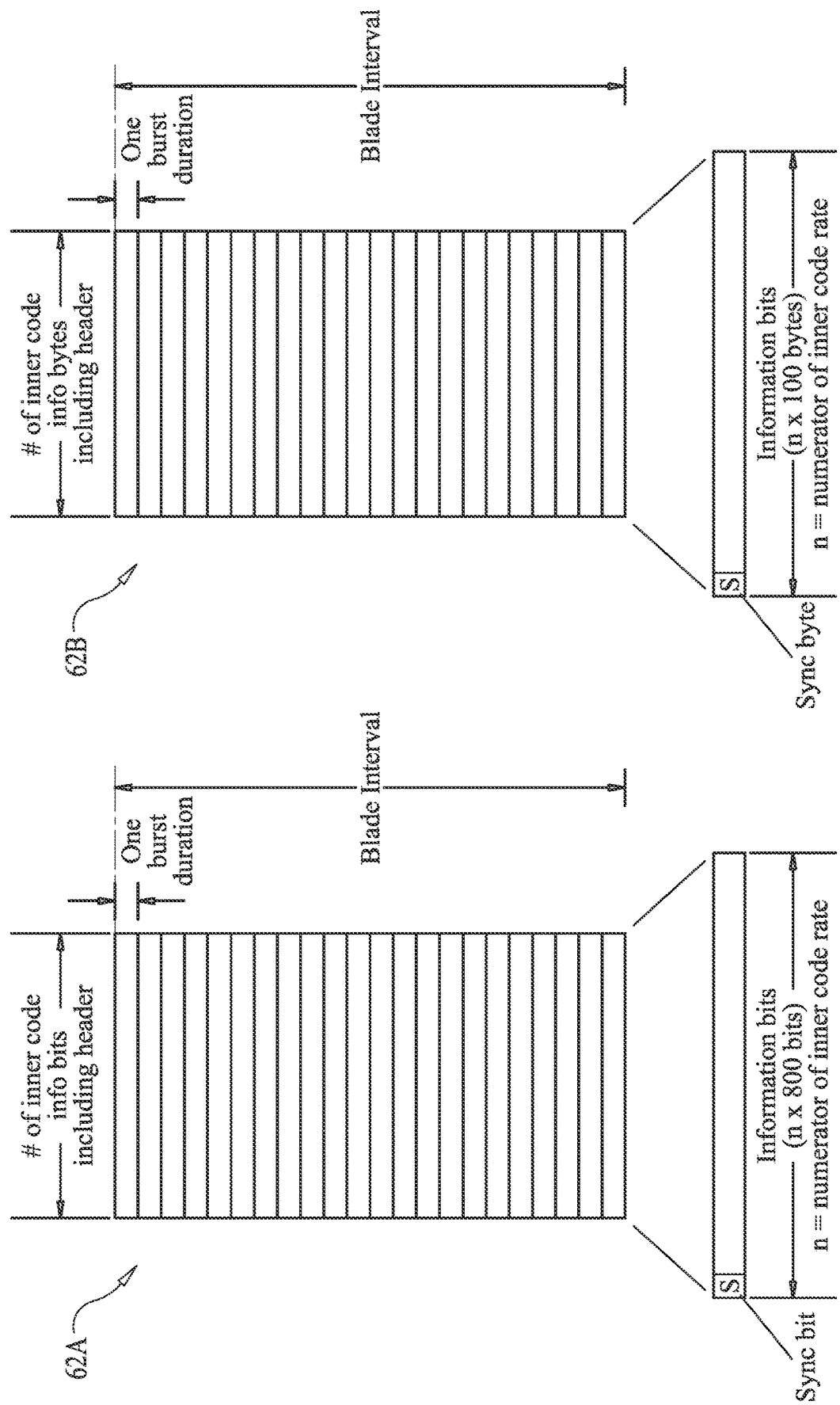
FIGS. 3A and 3B illustrates illustrated example embodiments of interleavers which are configured to operate in the system of FIG. 1.

In FIG. 3A, the number of columns is the number of information bits for an inner LDPC code. Each row represents one inner code block burst duration. The number of rows is equivalent to a blade cut interval. The bit interleaver 62A is filled with bits for the inner code block, including sync data elements (here, sync bits). The byte interleaver 62B is advantageous, for example, because byte accesses are more native to processors and faster than bit operations. In FIG. 3B, the number of columns is number of information bytes for an inner LDPC code. Each row represents one inner code block burst duration. The number of rows is equivalent to a blade cut interval. The byte interleaver 62B is filled with bits for the inner code block, including sync data elements (here, sync bytes).

The interleaver 62 size is variable as a function of the interval between blade blockages. The size of the outer code block 61 for the LDPC erasure code is fixed. For example, block size can be 134400 bits or 67200 bits. Data elements (e.g., bits or bytes) are read out from an outer code block buffer to fill the interleaver 62 column-wise. Each of the outer code blocks 61 hold information data elements across multiple inner bursts for the interleaver 62. An equivalent number of sync data elements equal to the number of inner bursts are placed, for example, at the beginning of the outer code block buffer. For an inner block code rate R=n/9 where n={1, 2, 3, 4, 6, 7}, the number of sync data elements (as bits or bytes) would be 168/n for an outer code block 134400-bit block size and 84/n for an outer code block 67200-bit block size. Since the size of the outer code block 61 and the interleaver 62 are different sizes, they complete at a different rate.

Figure 4:
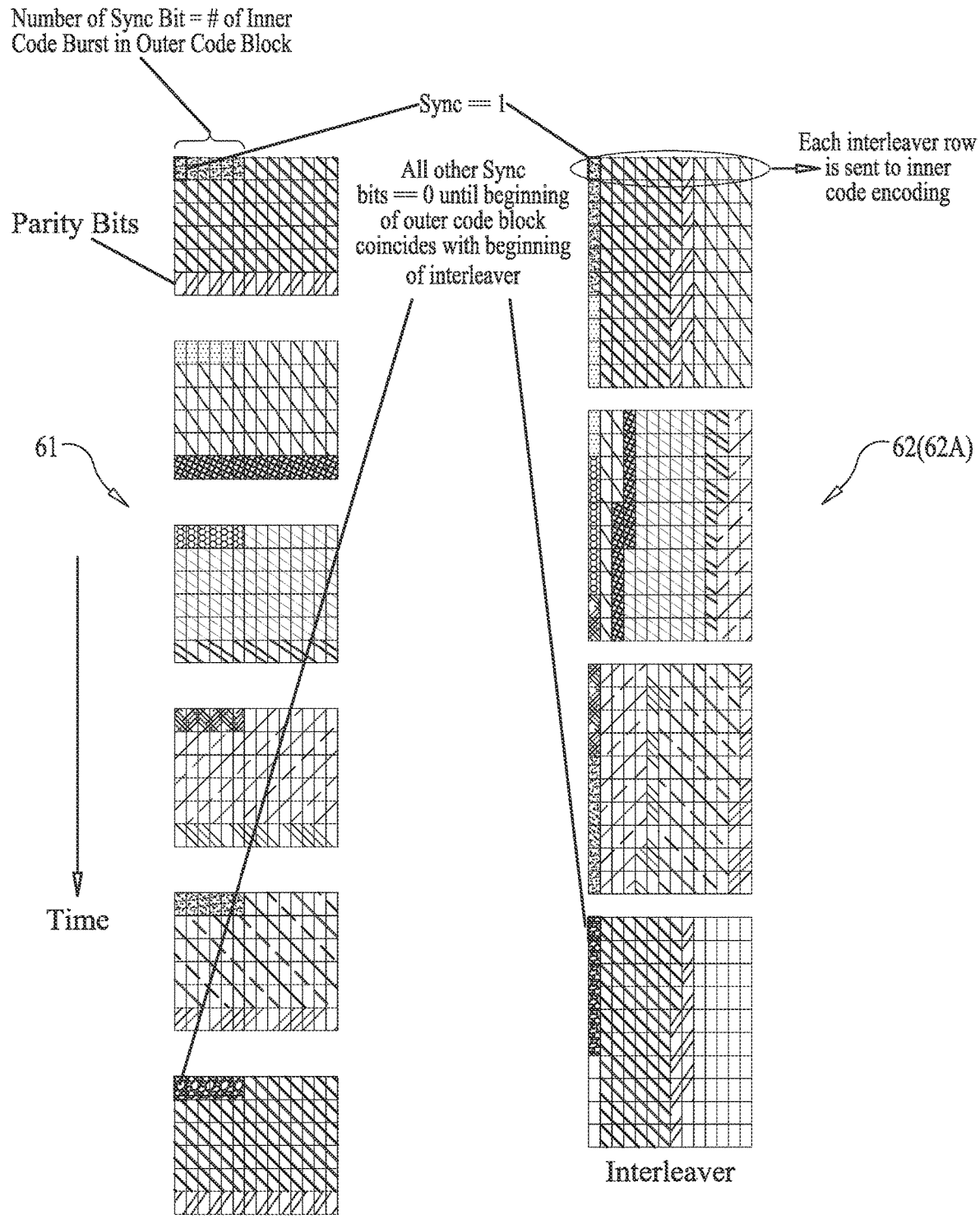
FIG. 4 illustrates an example embodiment of bit interleaving in accordance with the present disclosure.

FIG. 4 illustrates an example embodiment of bit interleaving in accordance with the present disclosure. FIG. 4 illustrates six outer code blocks 61 and four interleavers 62, with the outer code blocks 61 of the outer encoder 60 shown in the left column and the interleavers 62 shown in the right column. As illustrated, the outer code blocks 61 are sized differently than the interleavers 62. As illustrated, one or more data elements in each of the outer code blocks 61 are designated as sync data elements (here, sync bits). The sync data elements are distributed at the beginning of the first row of each outer code block 61. The rest of the data elements (e.g., information data elements) from the outer code blocks 61 (including the parity bits) are read column-wise into the interleavers 62 starting from column 2 onwards.

In the example shown in FIG. 4, for every five outer code blocks, three interleavers 62 are filled. The sync data elements in the outer code blocks 61 are read into the interleavers 62 down the same column. Here, the sync data elements in the outer code blocks 61 are read into the interleavers 62 down the first column, which is advantageous since the data element in the first column would be first data element of each row to arrive at the receiver for detection. Other bits from the outer code blocks 61 are placed starting from the second columns of the interleavers 62. In the illustrated example, the sync data elements at the beginning of the interleaver 62 that would also be the beginning of an outer code block are set to a first label, here, "1". All other sync data elements are set to a second or no label, here, "0". Thus, the sync data elements at the beginning of the interleaver 62 that would also be the beginning of an outer code block are set differently than all other sync data elements.

In the example of FIG. 4, the data elements are hashed differently to show correspondence between the outer code blocks 61 and the interleavers 62, namely, how the data elements from the outer code blocks 61 are written into the interleavers 62. Each of the outer code blocks 61 includes a plurality of data elements that are sync data elements. Here, each outer code block 61 includes six sync data elements in its first row. As illustrated, those sync data elements are consecutively written down the first columns of the interleavers 62 (e.g., the six sync data elements of the first outer code block 61 correspond to the first six down the first column of the first interleaver 61, the six sync data elements of the second outer code block 61 correspond to the last four down the first column of the first interleaver 62 and the first two down the first column of the second interleaver, etc.). The first sync data element in the first interleaver 62 and the first sync data element in the fourth interleaver 62 are labeled as with a first label (here, "1") because these are where the beginning of an outer code block 61 corresponds with the beginning of an interleaver 62. The rest of the sync data elements are labeled with a second or no label (here, "0"). The second or no label is different from the first label.

As illustrated, the data elements that are not sync data elements (e.g., information data elements and parity data elements) are written into the interleavers 62 beginning with the second columns of the interleavers. As illustrated, all columns from the second column onward of the first interleaver 62 are filled before moving on to the second column of the second interleaver 62. In another embodiment, the sync data elements shown in FIG. 4 can be written down another same column besides the first column, but the first column is advantageous since the data element in the first column would be first data element of each row to arrive at the receiver for detection.

Once each interleaver 62 row is complete, the data is sent for inner code coding by the inner encoder 64. In an embodiment, the data elements are read out of the interleaver 62 row-wise. For example, the first row of the first interleaver 62 is read out consecutively, then the second row of the first interleaver 62, etc., until the first interleaver 62 is finished. Then the second interleaver 62, third interleaver 62, etc. are read out row-wise in the same way. In an embodiment, the inner encoder 64 encodes each packet with an FEC code as an inner code (e.g., LDPC).

The modulator 66 receives the data elements from the inner encoder 64 and modulates the data elements for transmission to the receiver R. The data elements are then transmitted through the blockage channel B to the receiver R so that the receiver R can essentially perform the reverse process of the transmitter T. At the receiver R, the demodulator 68 demodulates the received transmission to retrieve the transmitted data elements.

In an embodiment, at the receiver R, all ULPE function stops until m number of inner code blocks with the sync data elements set are received at the proper interval apart (e.g., with m a small number such as 3). The inner decoder 70 attempts to decode the data. If the inner code is an LDPC code, the parity check equations of the inner decoder 70 indicate whether a particular kind of data packet has been correctly decoded or not. For other kinds of inner codes, such as turbo or convolutional codes, or for the case where there is no code, CRC bits can be used to determine whether each data packet is successfully received. The data elements are read into the deinterleaver 72 from the inner encoder 70. The deinterleaver 72 does not start filling until the inner code block with the sync data elements being set is received by the inner decoder 70. The inner burst with the sync data element set is placed in the first row of the deinterleaver 72. That is, the inner code block with the sync data elements set are used to populate the first row of the deinterleaver 72. The subsequent inner code blocks fill the following rows of the deinterleaver 72. The deinterleaver 72 then deinterleaves the data to present it to the outer decoder 74 in the initial format of the outer code blocks 61 from the outer encoder 60.

The sync data elements in the outer code buffer and the interleaver 62 are related. The sync data element labels/values are protected by the outer code when written into the interleaver 62. Correspondingly, the sync data element labels/values from the deinterleaver 72 ultimately go to outer decoder 74 where those sync data elements are subject to correction if they happen to be erased. The sync data elements will typically need to be aligned within the deinterleaver 72. It is not practical to wait for outer code decoding before using the sync data elements, so the sync data elements are detected as soon as the inner code burst is received at the receiver R. Under such usage, a known pattern of the sync data elements can be placed into the outer code block encoder buffer. The pattern is overwritten in the interleaver 62 as the inner bursts are constructed. For instance, the sync data element at the beginning of the interleaver 62 on the first row would be set to "1". At the deinterleaver 72, the beginning of the deinterleaver 72 would be determined by detecting the sync data element being set. The known pattern is written into the sync data element field for the outer code decoder buffer.

Figure 5:
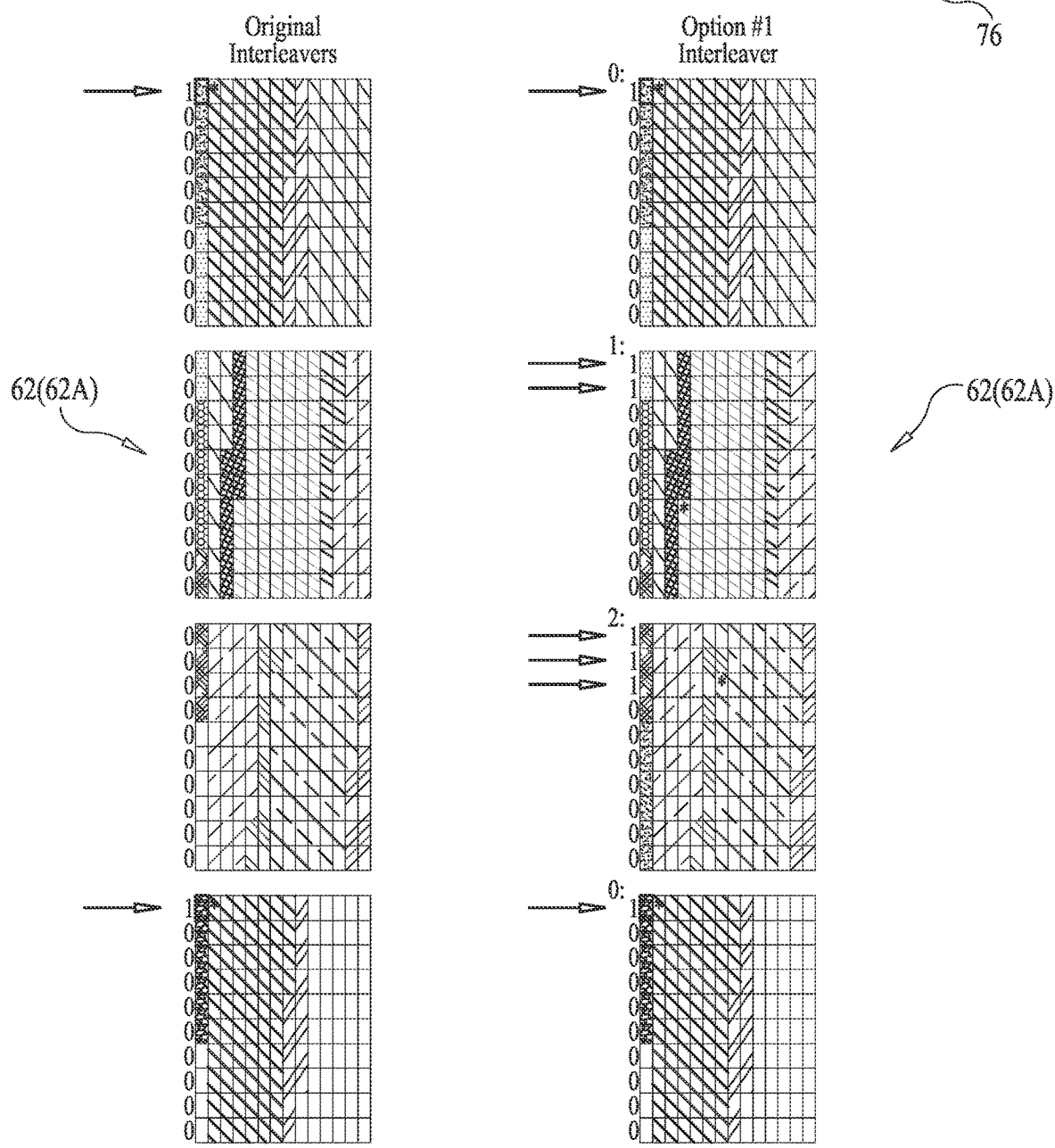
FIG. 5 illustrates an example embodiment of bit interleaving in accordance with the present disclosure.

Having one asserted sync data element field that aligns the beginning of the outer code block 61 and the beginning of the interleaver 62 can make synchronization take a while, particularly if there are many interleaver blocks (or outer code blocks) between the sync data element assertions. One way to reduce the synchronization time is to assert the sync data element field more often, such as at the beginning of each interleaver block. FIG. 5 illustrates an embodiment in which the system 10 asserts one additional row within an interleaver 62 to label successive interleaver blocks differently. As illustrated in FIG. 5, a sync table 76 can associate the interleaver label with the location of where the first full outer code block 61 occurs within the interleaver 62. Thus, the system 10 is configured to use a sync table 76 to distinguish between interleaver blocks.

In an embodiment, as seen in FIG. 5, the interleaver 62 size is equal to or larger than the outer code block size. The sync data element can be set on only the first interleaver 62 of the cycle (left diagram in FIG. 5). Successive interleavers can be encoded with longer series of asserted sync data elements. In FIG. 5, the first interleaver 62 of the cycle has one sync data element asserted. Successive interleavers 62 have more than one sync data element asserted. A maximum number of interleavers 62 (e.g., max_row−1) can be tagged. If there are more than max_row−1 interleavers 62 in a cycle, interleavers 62 can be equally tagged to reduce variance in the sync time. At the receiver R, a sync table 76 determines where the first outer code block 61 begins in the interleaver 62 for each sync pattern. The sync table 76 can include, for example, the interleaver number, the beginning of the sync row, the beginning of the outer code data (row, column), and the number of rows for synchronization.

In the example of FIG. 5, labels for the sync data elements are shown just to the left of the sync data elements. The first column of interleavers 62 shows the labeling from FIG. 4, while the second column of interleavers 62 shows how successive interleavers 62 can have more than one sync data element asserted. In the second column, the first interleaver 62 has one sync data element asserted (here, labeled as "1") which is the first sync data element in the column, the second interleaver 62 has two sync data elements asserted (here, labeled as "1") which are the first and second sync data elements in the column, the third interleaver 62 has three sync data elements asserted (here, labeled as "1") which are the first three sync data elements in the column, and the pattern repeats with the fourth interleaver 62. The fourth interleaver 62 has a first sync data element that corresponds to a first sync data element of an outer code block 61. The sync table 76 shows where the sync rows begin and where the outer code rows begin by row and column. As discussed above, the sync data elements shown in FIG. 5 can be written down another same column besides the first column, but the first column is advantageous since the data element in the first column would be first data element of each row to arrive at the receiver for detection.

In another embodiment, the outer code block 61 and the interleaver 62 operate with the inner code rate R=5/9. Since the number of sync data elements for the outer code block are 168/5=33.6 for a 134400-bit block size and 84/5=16.8 for a 67200-bit block size, the number of sync data elements within each outer code block 61 is not a constant. For instance, the number of sync data elements in successive outer code blocks 61 with the 134400-bit block size could be: 34, 33, 34, 33, 34, and repeat. Similarly, the number of sync data elements for the 67200-bit block size could be: 17, 16, 17, 17, 17, and repeat. Like with the embodiment illustrated in FIG. 5, a table 76 can associate the interleaver labels with the first full outer code block 61 as well as where in the number of sync bits sequence it is in.

Synchronization using multiple rows of the interleaver 62 can be disadvantageous since any of these rows can be erased, thus rendering a sync label unusable. To synchronize, an interleaver 62 cannot have any consecutive bursts erased. As the erasure rate increases, the time to synchronize is lengthened. Seeking to reduce the time to synchronization, a sync byte is introduced for the sync labeling for use in byte interleavers 62B, such as those shown in FIG. 3B. As an added benefit, the byte interleaver 62B allows much faster accessing time of the buffers, particularly for processors.

Figure 6:
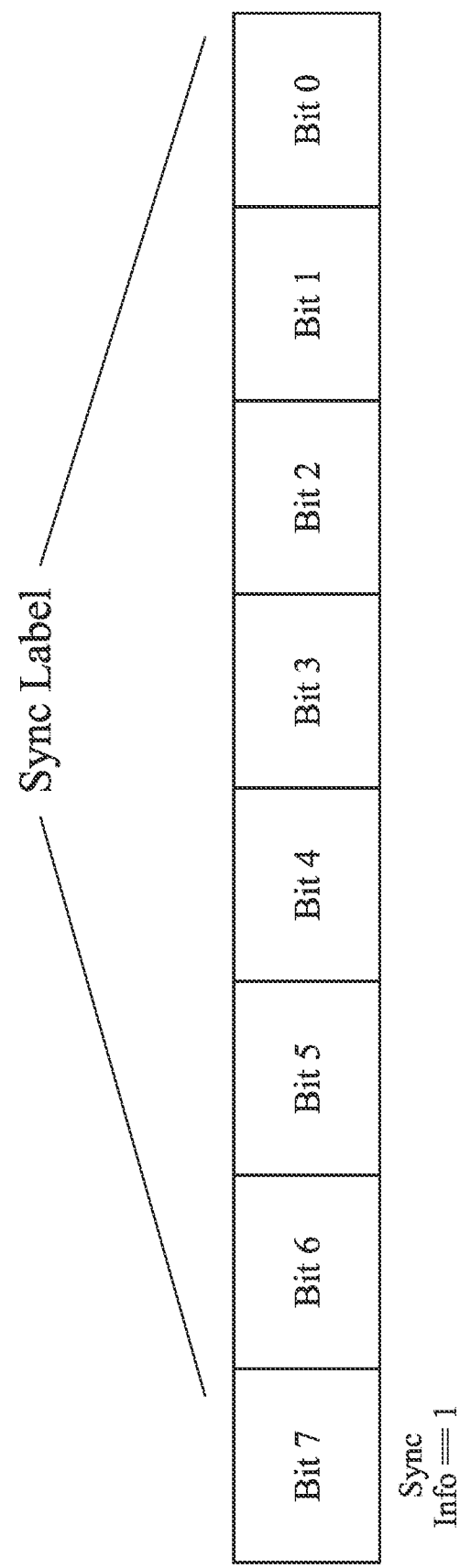
FIG. 6 illustrates an example embodiment of byte interleaving in accordance with the present disclosure.
Figure 7:
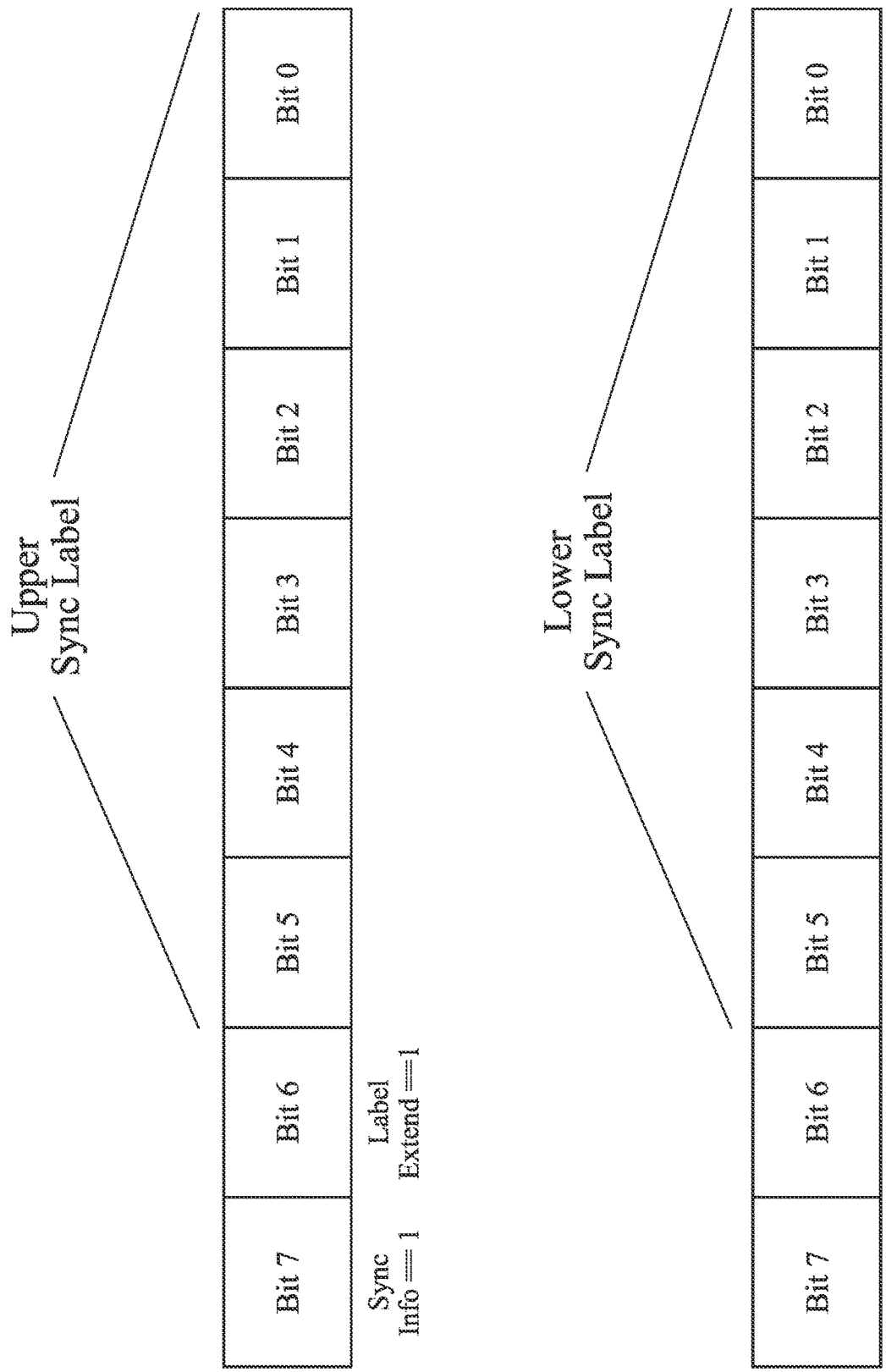
FIG. 7 illustrates an example embodiment of byte interleaving in accordance with the present disclosure.

The sync byte can used as a label. As shown in FIG. 6, a sync byte can set a bit such as the Sync Info to indicate that the rest of the bit field in the byte contains the unique label identifier. In this case, up to 128 sync labels can be generated that would fit into a byte—or a single inner burst transmission. Like before, more labels can be created by concatenating the synchronization information across multiple sync bytes. As shown in FIG. 7, up to 2 labels are available by concatenating two sync bytes together. As many as 32-bit sync labels can be generated through concatenation.

Figure 8:
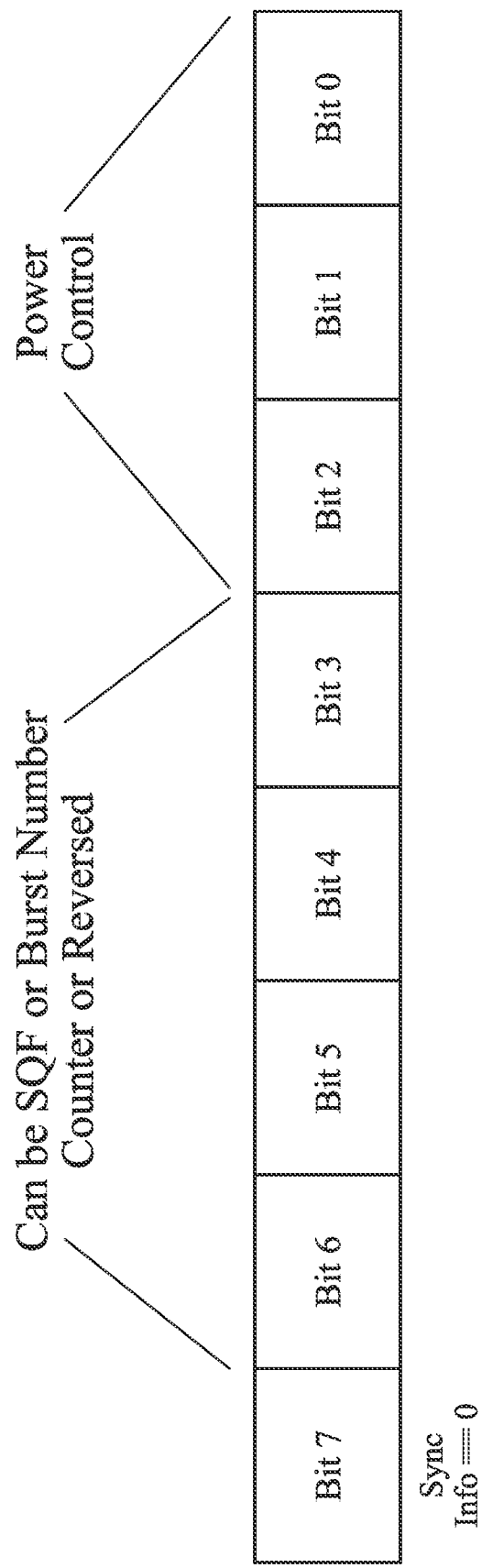
FIG. 8 illustrates an example embodiment of byte interleaving in accordance with the present disclosure.

When the sync byte does not carry synchronization information, the bit field can be used for other real-time applications. As shown in FIG. 8, for example, the bit field can be used to carry power control signaling, signal quality factor, burst number counter, etc.

Figure 9:
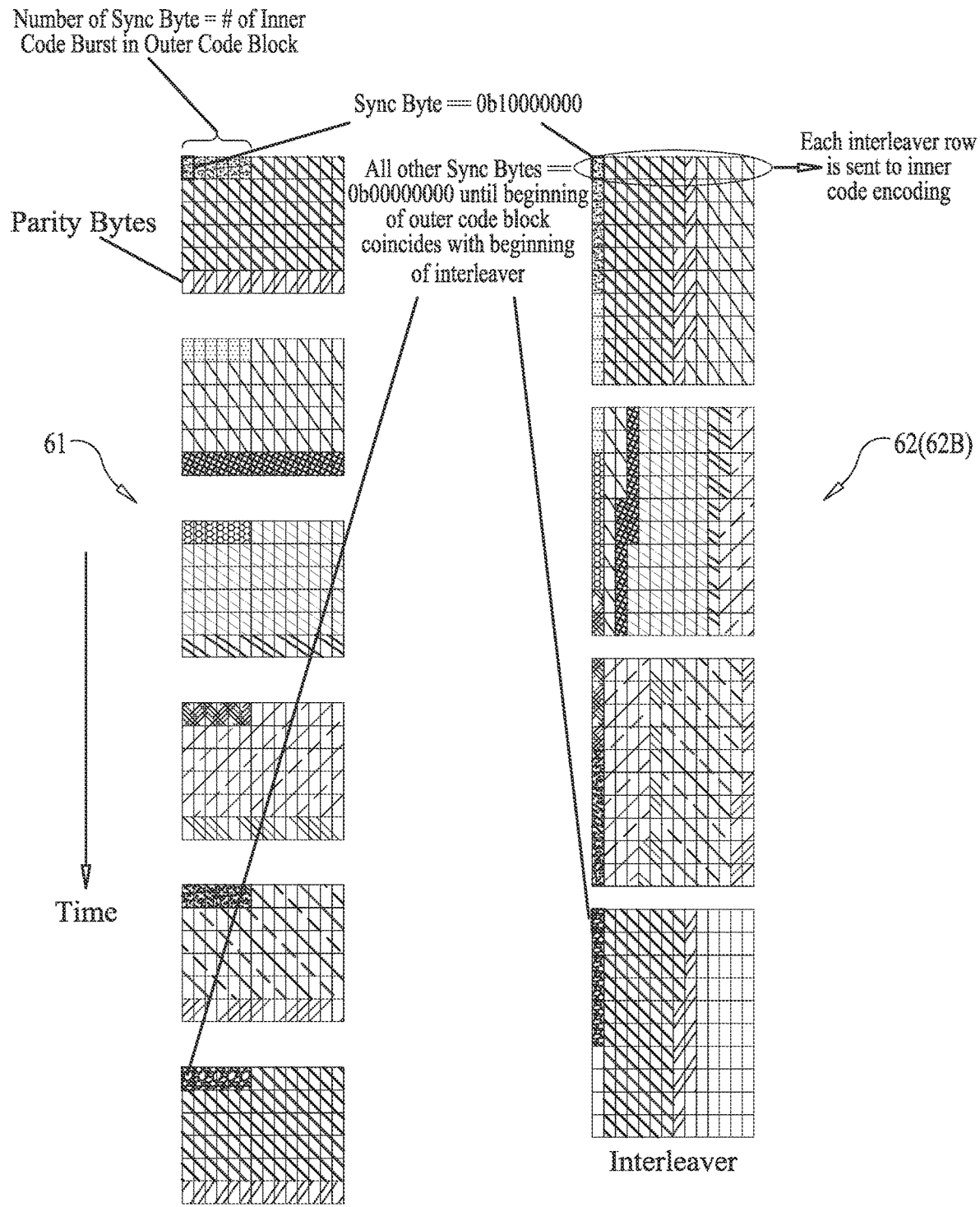
FIG. 9 illustrates an example embodiment of byte interleaving in accordance with the present disclosure.

The basic sync byte usage is similar to the basic sync bit usage in accordance with the present disclosure. As before, the sync data element is placed at the beginning of the outer code block 61 and the interleaver 62. But rather than needing to utilize multiple interleaver rows, the sync byte can use multiple sync labels to identify each interleaver block, for example as shown in FIG. 9, with only one single inner burst transmission. This reduces the chance of having part of the sync information partially erased. One sync label can be used per sync cycle (e.g., sync byte=0b10000000). The sync byte field populates the beginning of the outer code block 61. There are as many sync bytes as there are the number of inner code blocks 61 that fit in the outer code block size. The sync bytes are written to the same column of the interleaver 62. Here, the same column is the first column, which is advantageous since the data element in the first column would be first data element of each row to arrive at the receiver for detection. In the illustrated embodiment, the sync byte is set to 0b10000000 label for the byte at the beginning of the outer code block 61 that is also the beginning of the interleaver 62. Bytes other than the sync bytes populate the interleaver 62 column-wise starting at the second column. Once the interleaver 62 is filled, each row of the interleaver 62 is sent to the inner encoder 64. At the receiver, all ULPE function stops until m number of the inner code blocks with sync bytes set to 0b10000000 are received at the proper interval apart (e.g., with m as a small integer such as 3). The inner code block with the sync bytes set populates the first row of the deinterleaver 72. Subsequent inner code blocks fill the following rows of the deinterleaver 72.

In the example of FIG. 9, the data elements (here, bytes) are hatched differently to show correspondence between the outer code blocks 61 and the interleavers 62, namely, how the data elements from the outer code blocks 61 are written into the interleavers 62. Each of the outer code blocks 61 includes a plurality of data elements that are sync data elements (here, bytes with sync labels). Here, each outer code block 61 includes six sync data elements in its first row. As illustrated, those sync data elements are written down the first column of the interleavers 61 (e.g., the six sync data elements of the first outer code block 61 correspond to the first six down the first column of the first interleaver 61, the six sync data elements of the second outer code block 61 correspond to the last four down the first column of the first interleaver 62 and the first two down the first column of the second interleaver, etc.). The first sync data element in the first interleaver 62 and the first sync data element in the fourth interleaver 62 are labeled with a first label (here, "1b10000000") because these are where the beginning of an outer code block 61 corresponds with the beginning of an interleaver 62. The rest of the sync data elements are labeled with a second or no label (e.g., 0). The second label is different from the first label. As illustrated, the data elements that are not sync labels (e.g., information bytes or parity bytes) are written into the interleavers 62 beginning with the second columns of the interleavers. As illustrated, all columns from the second column onward of the first interleaver 62 are filled before moving on to the second column of the second interleaver 62. As discussed above, the sync data elements shown in FIG. 9 can be written down another same column besides the first column, but the first column is advantageous since the data element in the first column would be first data element of each row to arrive at the receiver for detection.

Figure 10:
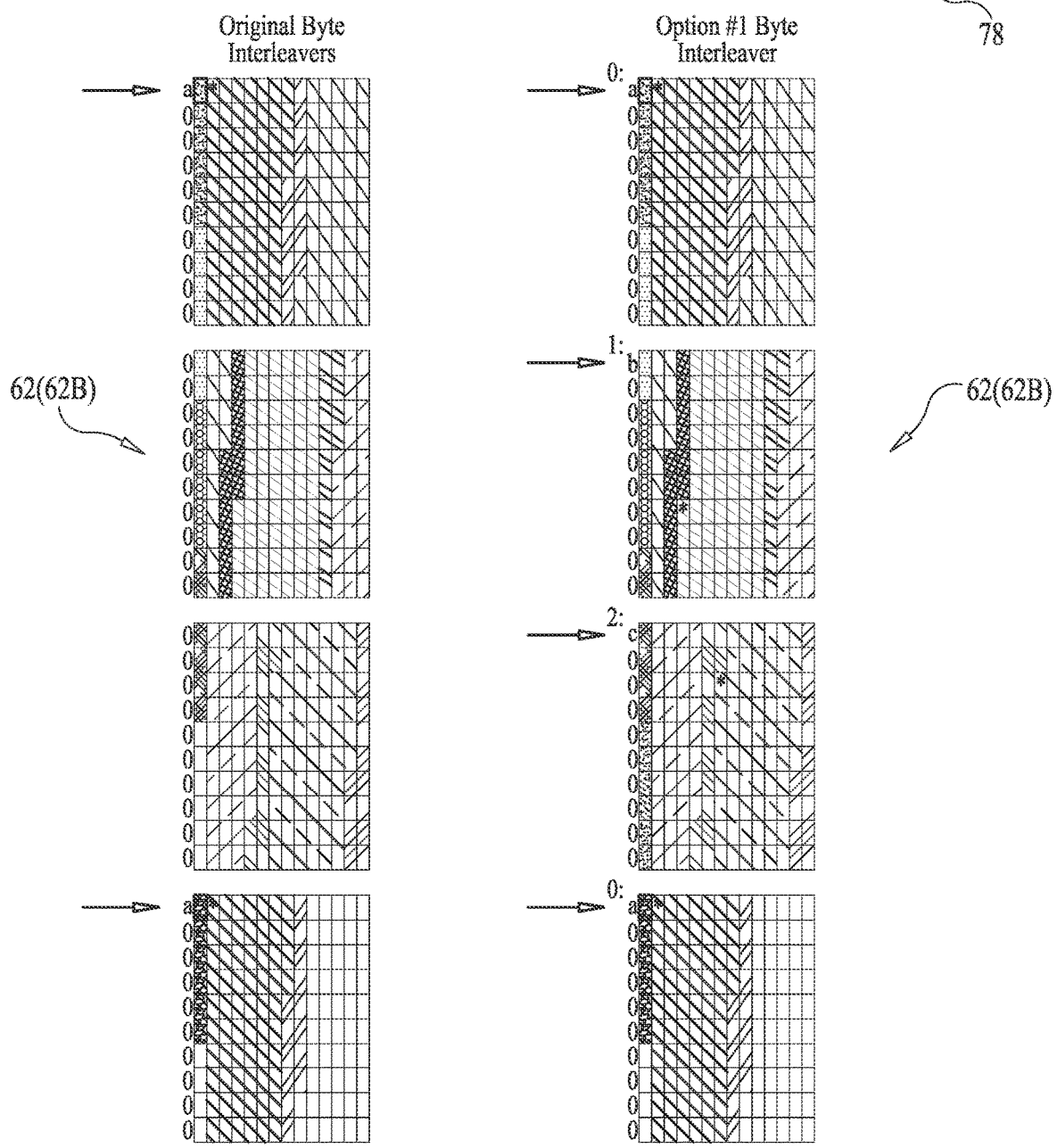
FIG. 10 illustrates an example embodiment of byte interleaving in accordance with the present disclosure.
Figure 11:
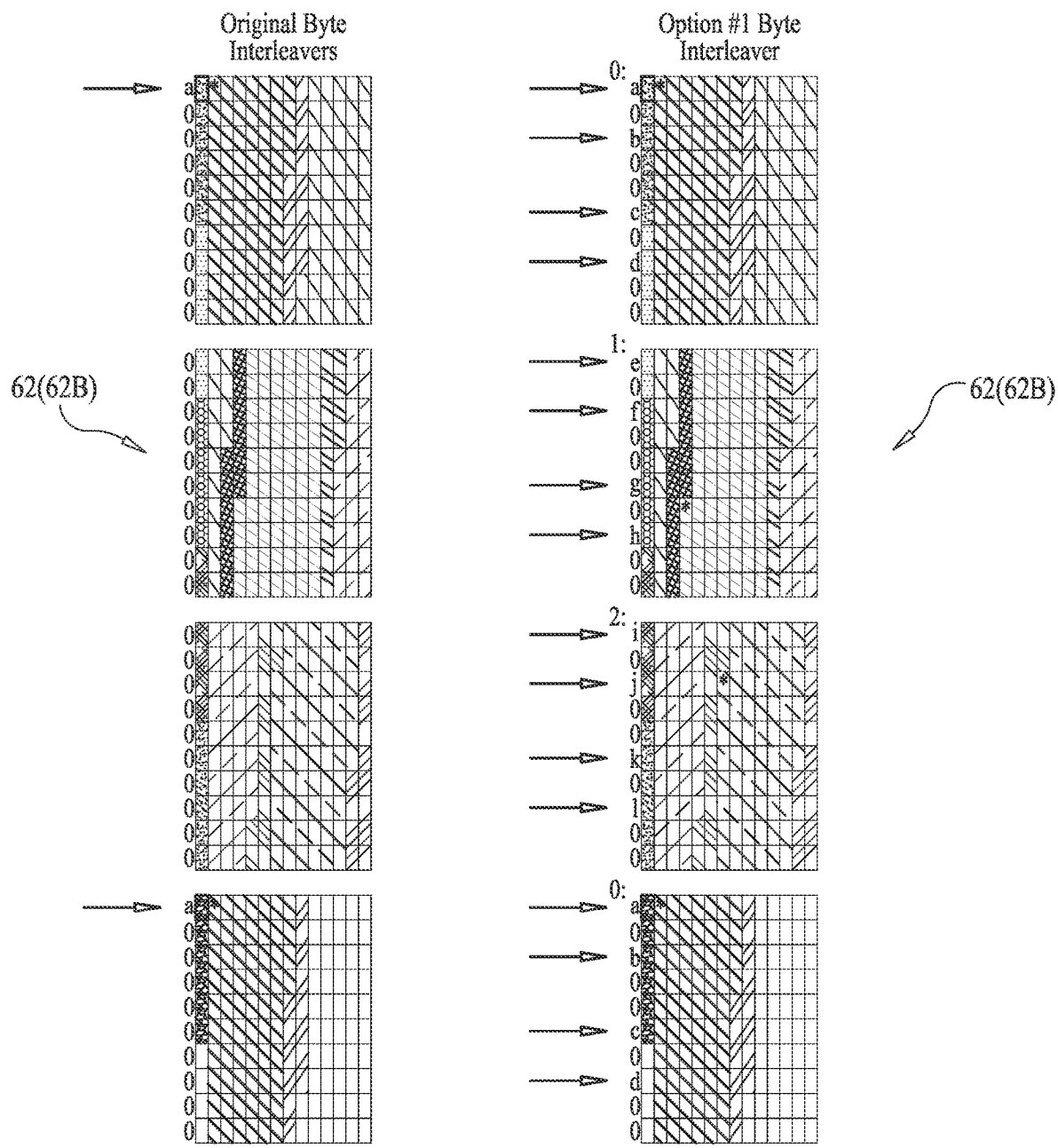
FIG. 11 illustrates an example embodiment of byte interleaving in accordance with the present disclosure.
Figure 12:
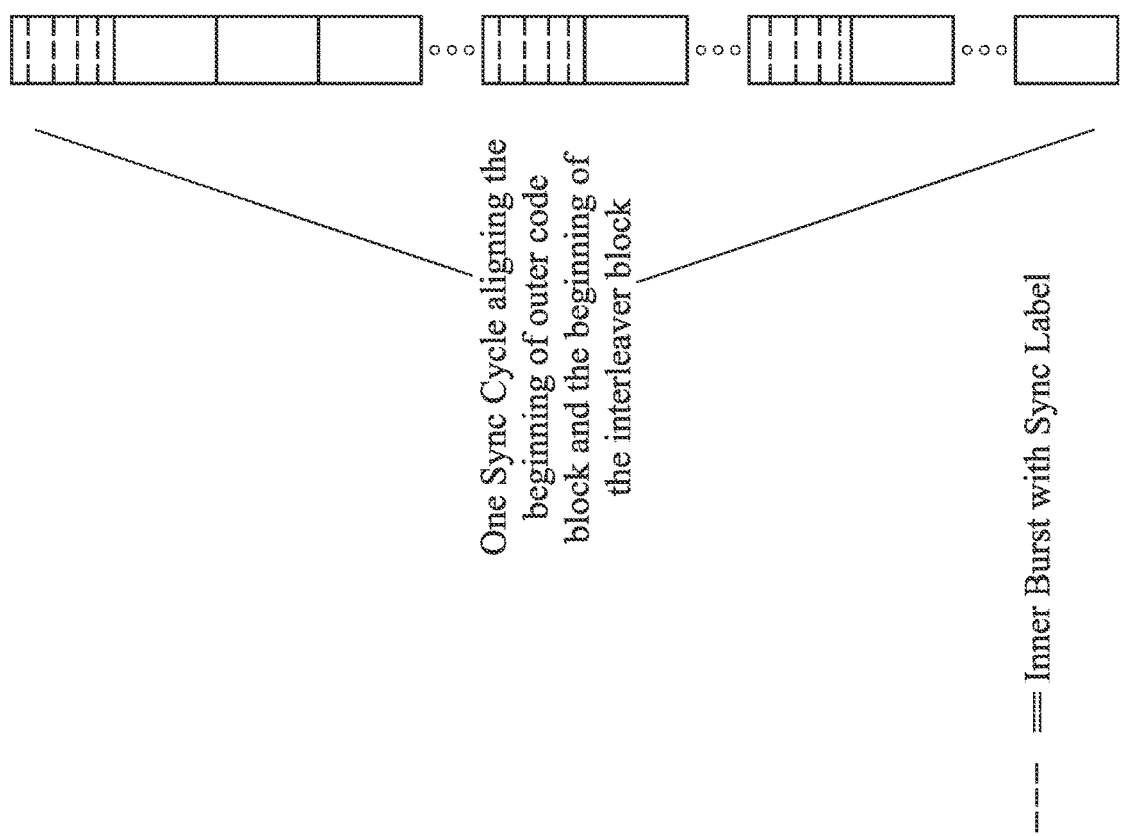
FIG. 12 illustrates an example embodiment of byte interleaving in accordance with the present disclosure.

As seen in FIG. 10, a sync table 78 that associates the sync data elements with the interleaver number and the beginning of the outer code block location within the interleaver 62 is established to identify where in the synchronization cycle the sync data element is located. Since there may be more sync data elements than there are interleaver blocks within a sequence of interleavers 62 before the next synchronization alignment with the beginning of the outer code block, more than one sync data element can be used within an interleaver block. This increases the chance that a sync data element will survive the erasures within a given interleaver blockage interval time. An example of multiple asserted sync data elements within an interleaver is shown in FIG. 11. To increase the likelihood of synchronization within one interleaver duration, the number of sync elements can be the reciprocal of the erasure rate plus one. The erasure rate is the blockage duration within a blockage interval divided by the blockage interval. If there are not enough sync data elements, a required concentration of the labels can be dedicated to evenly spaced interleaver blocks to reduce the time to achieve synchronization while increasing the likelihood of surviving the blade cut blockages, as shown in FIG. 12.

In FIG. 10, the interleaver 62 size is equal to or larger than the outer code block size. The sync data element is set to "a" on the first interleaver 62 (0) of the sync cycle. Successive interleavers 62 (1, 2) are encoded with different labels (b, c). In the case of n-bit sync data elements, up to $2^n$ interleavers 62 can be tagged (e.g., 7 bits=128 labels). If there are more interleavers 62 than a $2^n$ pattern in a cycle, equally spaced interleavers 62 can be tagged to reduce the variance of sync time. At the receiver R, a sync table 78 can include an interleaver number, an outer code block number, and the start of the outer code block in the interleaver (row, column).

In the example of FIG. 10, labels for the sync data elements are shown just to the left of the sync data elements. The first column of interleavers 62 shows labeling similar to FIG. 9, while the second column of interleavers 62 shows an additional embodiment. In the second column of interleavers 62, the first interleaver 62 has a sync data element asserted with a first label (here, a) which is the first sync data element in the column, the second interleaver 62 has a sync data element asserted with a second label (here, b) which is the first sync data element in the column, the third interleaver 62 has a sync data element asserted with a third label (here, c) which is the first sync data element in the column, and the pattern repeats with the fourth interleaver 62. The fourth interleaver 62 is labeled the same as the first interleaver 62 because the first sync data element corresponds to the first sync data element in an outer code block. The sync table 78 shows where the sync rows begin and where the outer code rows begin by row and column. As discussed above, the sync data elements shown in FIG. 10 can be written down another same column besides the first column, but the first column is advantageous since the data element in the first column would be first data element of each row to arrive at the receiver for detection.

In the example of FIG. 11, labels for the sync data elements are shown just to the left of the sync data elements. The first column of interleavers 62A shows labeling similar to FIG. 9, while the second column of interleavers 62A shows an additional embodiment. In FIG. 11, the interleaver 62 size is equal to or larger than the outer code block size. To increase the probability of synchronization within one interleaver duration, more than one sync data element is asserted per interleaver 62. The outer code rate is set to correct a worst-case blockage. FIG. 11 assumes a uniform probability of blockage, putting more than one sync data element than the reciprocal of the outer code rate so that at least one sync data element survives the blade blockages per interleaver duration. The labels are placed uniformly throughout the interleaver 62. At the receiver R, the sync table 78 can be used to determine where the first outer code block begins in the interleaver for each label. The sync table 78 can include the interleaver number, the interleaver row, the outer code block number, and the start of the outer code block in the interleaver (row, column). As discussed above, the sync data elements shown in FIG. 11 can be written down another same column besides the first column, but the first column is advantageous since the data element in the first column would be first data element of each row to arrive at the receiver for detection.

In FIG. 12, not every interleaver 62 contains a sync byte with a sync label, if there are not enough labels. Some interleavers 62 have more than one sync labels to guarantee that one sync label survives the blade cuts. Bursts of sync labeling are distributed uniformly throughout the sync cycle to minimize synchronization time. If a sync label extension is used to make more sync labels, the extension pattern can be uniformly distributed within the interleaver 62, such as within successive interleaver rows.

Figure 13:
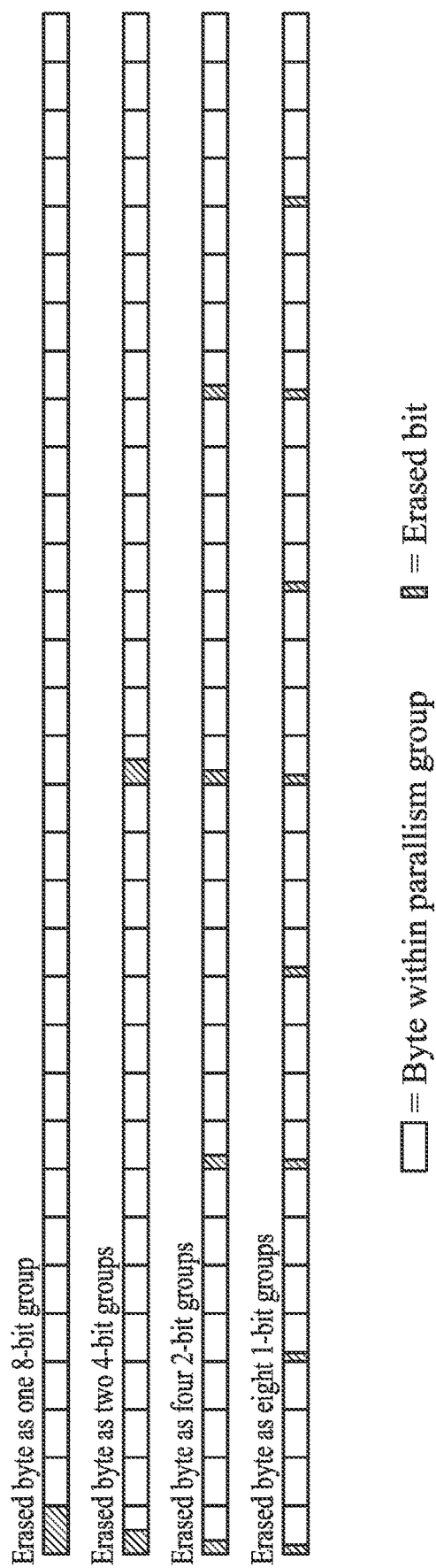
FIG. 13 illustrates an example embodiment of byte interleaving in accordance with the present disclosure.

Using a byte interleavers 62B has a poorer erasure correction capability than using a bit interleaver 62A. Since the outer encoder 60 and outer decoder 74 take in a group of parallel bits, such as 128 bits or 256 bits at a time, local interleaving of the parallel input bits can recover some of the capability loss of using a byte interleaver 62B. Each byte can split up to smaller groups of bits. Rather than a single byte taken 8 consecutive bits to the interleaver 62 or from the deinterleaver 72, the bits within a single byte can come from bytes spaced apart. As shown in the top row of FIG. 13, a byte can be a single byte in the parallel input. In another embodiment, a byte can be two groups of 4 bits spaced half of the input port width apart. In another embodiment, a byte can be four groups of two bits spaced a quarter of the input width apart. In another embodiment, a byte can be eight groups of a single bit spaced an eighth of the input port width apart. For interleavers 62 done in bytes rather than bits, erasures appear in groups of 8 bits. The system 10 aims to spread out erasures throughout the parallelist group (shown in FIG. 13 for M=256). The erasures can be spread as a byte, nibble, double-bit, or single-bit erasures.

As shown in FIG. 14, compared to the straight byte interleaving without local interleaving, the local interleaving with two groups of 4 bits, four groups of 2 bits, or eight groups of 1 bit can recover some of the erasure correction capability of the bit interleaver 62A. The results are collected using a limit of 150 maximum iterations. The peak number of iterations is taken for all correctly decoded trials.

Synchronization using erasure code is possible with through bit interleavers 62A and byte interleavers 62B. With the advantages of higher likelihood to synchronize in a reduced time duration, the byte interleavers 62B allow greater access speed using a processor. The loss in erasure correction capability of the byte interleaving can be recovered somewhat with local interleaving of the input parallel port width.

The embodiments described herein provide improved terminals, systems and methods for transmitting data through periodically blocked channels such as those subjected to rotating helicopter blades or similar obstacles of periodic nature. These terminals, systems and methods are advantageous, for example, because they reduce acquisition time. It should be understood that various changes and modifications to the systems and methods described herein will be apparent to those skilled in the art and can be made without diminishing the intended advantages.

General Interpretation of Terms

In understanding the scope of the present invention, the term "comprising" and its derivatives, as used herein, are intended to be open ended terms that specify the presence of the stated features, elements, components, groups, and/or steps, but do not exclude the presence of other unstated features, elements, components, groups, integers and/or steps. The foregoing also applies to words having similar meanings such as the terms, "including", "having" and their derivatives. Also, the terms "part," "section," or "element" when used in the singular can have the dual meaning of a single part or a plurality of parts.

The term "configured" as used herein to describe a component, section or part of a device includes hardware and/or software that is constructed and/or programmed to carry out the desired function.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such features. Thus, the foregoing descriptions of the embodiments according to the present invention are provided for illustration only, and not for the purpose of limiting the invention as defined by the appended claims and their equivalents.

What is claimed is:

1. A method for improving communication throughput when experiencing periodic blockages, the method comprising:
    generating a first outer code block comprising a plurality of first sync data elements and a second outer code block comprising a plurality of second sync data elements;
    writing multiple of the first sync data elements from the first outer code block and at least one second sync data element from the second outer code block to a first column of a first interleaver comprising a plurality of rows and a plurality of columns;
    writing remaining second sync data elements from the second outer code block to a first column of a second interleaver comprising a plurality of rows and a plurality of columns; and
    writing additional data elements from the first outer code block and the second outer code block to other columns of the first interleaver or the second interleaver.

2. The method of claim 1, wherein
    the first interleaver and the second interleaver are bit interleavers,
    the sync data elements comprise sync bits, and
    the additional data elements comprise additional bits.

3. The method of claim 1, wherein
    the first interleaver and the second interleaver are byte interleavers,
    the sync data elements comprise sync bytes, and
    the additional data elements comprise additional bytes.

4. The method of claim 1, further comprising
    accessing a sync table to determine when the second outer code block begins.

5. The method of claim 1, wherein
    the first outer code block is a different size than the first interleaver.

6. A communication terminal or gateway comprising a controller and a memory, the controller programmed to perform the method of claim 1 by executing instructions stored on the memory.

7. The method of claim 1, comprising
    using the sync data elements to identify each location where a beginning of an outer code block corresponds to a beginning of an interleaver.

8. The method of claim 1, comprising
    accessing a sync table identifying, for each of the first interleaver and the second interleaver, a first location where a sync row begins, a second location where an outer code row begins, and a third location where an outer code column begins.

9. A method for improving communication throughput when experiencing periodic blockages, the method comprising:
    generating a plurality of outer code blocks each comprising at least one sync data element;
    writing the sync data elements from the plurality of outer code blocks to same columns of a plurality of interleavers each comprising a plurality of rows and a plurality of columns; and distinguishing between different interleavers of the plurality of interleavers using a longer series of asserted sync data elements down the same columns of one interleaver compared to another interleaver.

10. The method of claim 9, wherein
the plurality of interleavers comprise a plurality of bit interleavers, and
the sync data elements comprise sync bits.

11. The method of claim 9, wherein
the plurality of interleavers comprise a plurality of byte interleavers, and
the sync data elements comprise sync bytes.

12. The method of claim 9, wherein
the same columns of the plurality of interleavers are the first columns of the plurality of interleavers, and
the writing writes additional data elements from the plurality of outer code blocks beginning at second columns of the plurality of interleavers.

13. The method of claim 9, wherein
the distinguishing between different interleavers of the plurality of interleavers further includes using a sync byte with multiple labels to identify the plurality of interleavers.

14. The method of claim 9, wherein
the outer code blocks are sized differently than the interleavers.

15. A method for improving communication throughput when experiencing periodic blockages, the method comprising:
generating a plurality of outer code blocks each comprising a plurality of sync bytes and a plurality of additional bytes;
writing the plurality of sync bytes and the plurality of additional bytes from the plurality of outer code blocks into a plurality of interleavers each comprising a plurality of rows and a plurality of columns, such that the sync bytes are written down first columns of the plurality of interleavers and the plurality of additional bytes are written down other columns of the plurality of interleavers; and
using sync bytes with multiple labels to identify each location where a beginning of an outer code block of the plurality of outer code blocks corresponds to a beginning of an interleaver of the plurality of interleavers.

16. The method of claim 15, comprising
identifying where in a synchronization cycle a particular sync byte is located using a sync table.

17. The method of claim 15, comprising
identifying at least one of the plurality of interleavers using more than one sync byte.

18. The method of claim 15, comprising
writing the bytes from the outer code block column-wise into the plurality of interleavers.

19. The method of claim 15, comprising
reading the bytes from the plurality of interleavers row-wise to an inner encoder.

20. The method of claim 15, comprising
asserting a number of multiple sync bytes within the interleavers, the number being a reciprocal of an erasure rate plus one.

* * * * *